United States Patent
Kakimoto

[11] Patent Number: 5,083,490
[45] Date of Patent: Jan. 28, 1992

[54] PUNCHING UNIT FOR PUNCHING APPARATUS

[75] Inventor: Masakazu Kakimoto, Aichi, Japan
[73] Assignee: Ushio Co., Ltd., Aichi, Japan
[21] Appl. No.: 384,802
[22] Filed: Jul. 25, 1989
[30] Foreign Application Priority Data Jul. 28, 1988 [JP] Japan .................. 63-100891[U]

[51] Int. Cl.⁵ .................................................. B26D 5/04
[52] U.S. Cl. .................................... 83/556; 83/561;
83/588; 83/639.1; 83/916
[58] Field of Search ............. 83/556, 561, 571, 588,
83/640, 684, 685, 696, 639.1, 549, 916

[56] References Cited

U.S. PATENT DOCUMENTS

| | | | |
|---|---|---|---|
| 3,147,657 | 9/1964 | Williamson | 83/639.1 |
| 3,370,492 | 2/1968 | Treff | 83/556 |
| 3,741,062 | 6/1973 | Glastra | 83/556 |
| 4,067,252 | 1/1978 | Peddinghaus et al. | 83/571 |
| 4,667,553 | 5/1987 | Gerber et al. | 83/561 |
| 4,674,373 | 6/1987 | Kuppinger | 83/561 |

FOREIGN PATENT DOCUMENTS 63-267195 11/1988 Japan .

*Primary Examiner*—Mark Rosenbaum
*Assistant Examiner*—Scott A. Smith
*Attorney, Agent, or Firm*—Sandler, Greenblum & Bernstein

[57] ABSTRACT

In a punching unit for punching apparatus having a punch removably mounted on the upper half side of a support section formed nearly in a channel-shape such that the punch will face a die mounted on the lower half side of the support section, and a lifting mechanism for vertically moving the punch, a flat force-cutting blade is attached at the bottom end of the punch rotatably mounted on the support section, and a lifting mechanism is provided in the support section to turn the punch through an angle of 90 degrees.

2 Claims, 2 Drawing Sheets

PUNCHING UNIT FOR PUNCHING APPARATUS

BACKGROUND OF THE INVENTION

1. Field of the Invention

The present invention relates to a punching unit for punching apparatus and, more particularly, to improvements in a structure around a die used in a punching unit set in the punching apparatus for producing holes in predetermined points of thin sheet materials, such as wiring base boards, flexible films, metal films, prepregs, or the like, and constituted mainly of a die and a die facing thereto.

2. Description of Background and Relevant Information

A punching unit for punching apparatus has previously been proposed by the applicant of the present invention in Japanese Patent Application No. Sho 62-102198.

The punching unit for punching apparatus according to the applicant's previous proposition comprises a support section formed in a nearly ]-shape or vertically oriented channel shape; a punch removably mounted on the upper half side thereof, such that it will face a die mounted on the lower half side of the support section; and a lifting mechanism for vertically moving the punch movably mounted on the support section, and removably connected to the punch.

According to the present applicant's previous proposition, the punching unit for punching apparatus has such an advantage that the punch can readily be replaced because of its releasability from the support section and the lifting mechanism.

The punching unit for the punching apparatus previously proposed by the present applicant has a problem to be solved that the punching unit is not fully applicable to accurately punching relatively large holes without distortion and burrs because it produces holes by as if pressing to cut a material.

The present invention has been accomplished in an attempt to solve the problem mentioned above, and has as its object the provision of a punching unit for punching apparatus that enables easy replacement of the punch and also thorough application to the punching of relatively large square holes.

To accomplish the aforementioned object, the punching unit for punching apparatus includes a punch removably mounted on the upper half side of a support section formed in a nearly ]-shape such that the punch will face a die mounted on the lower half side of the support section, and a lifting mechanism removably connected to the punch and vertically movably mounted on the support section to move the punch up and down; a means comprising a flat force-cutting blade is attached on the bottom end of the punch, a punch is rotatably mounted on the support section, and a rotating mechanism is provided on the support section for turning the punch through 90 degrees.

The means described above, using the structure that enables the mounting of the punch to, and the removal of the same from, the support section and the lifting mechanism, can fulfill the object to maintain the advantage of the present applicant's proposition, that is, the facilitation of punch replacement.

Furthermore, since the punch having a flat force-cutting blade is turned through 90 degrees by a punch rotating mechanism to cut each side of a square hole in the material, it is possible to accurately produce relatively large square holes without distortion and burrs, thus accomplishing the object of the present invention.

Other objects, features and advantages of the present invention will become more apparent from the following detailed description of the preferred embodiment when read in connection with the accompanying drawings.

BRIEF DESCRIPTION OF THE DRAWINGS

FIG. 1 is a side sectional view showing an embodiment of a punching unit for punching apparatus according to the present invention;

FIG. 3 is a sectional view taken along line 3—3 of FIG. 1; and

DESCRIPTION OF THE PREFERRED EMBODIMENT

Figure 2:
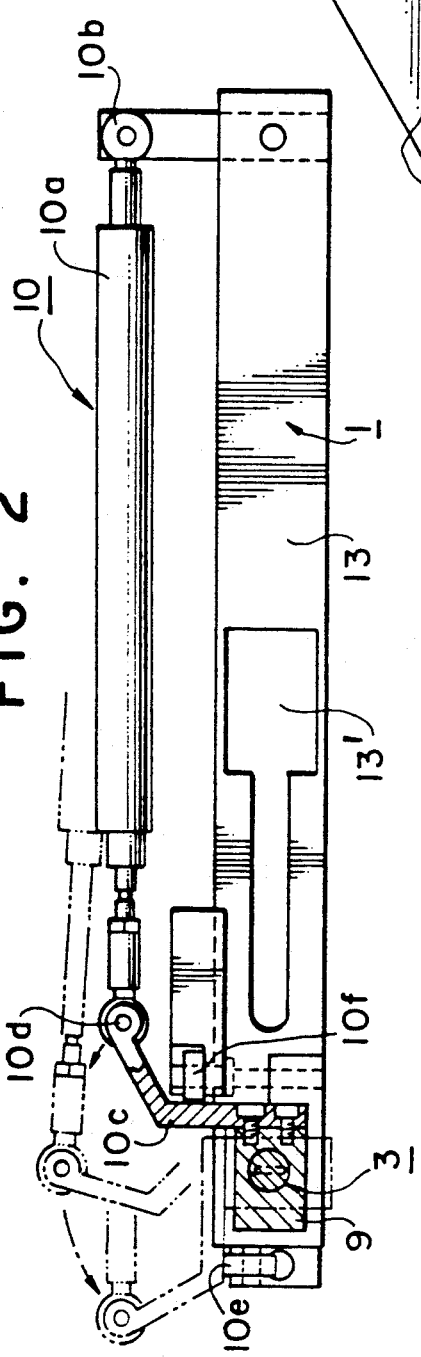
FIG. 2 is a sectional view taken along line 2—2 of FIG. 1.

Hereinafter an exemplary embodimetn of a punching unit for punching apparatus according to the present invention will be described with reference to the accompanying drawings.

Figures 1, 3:
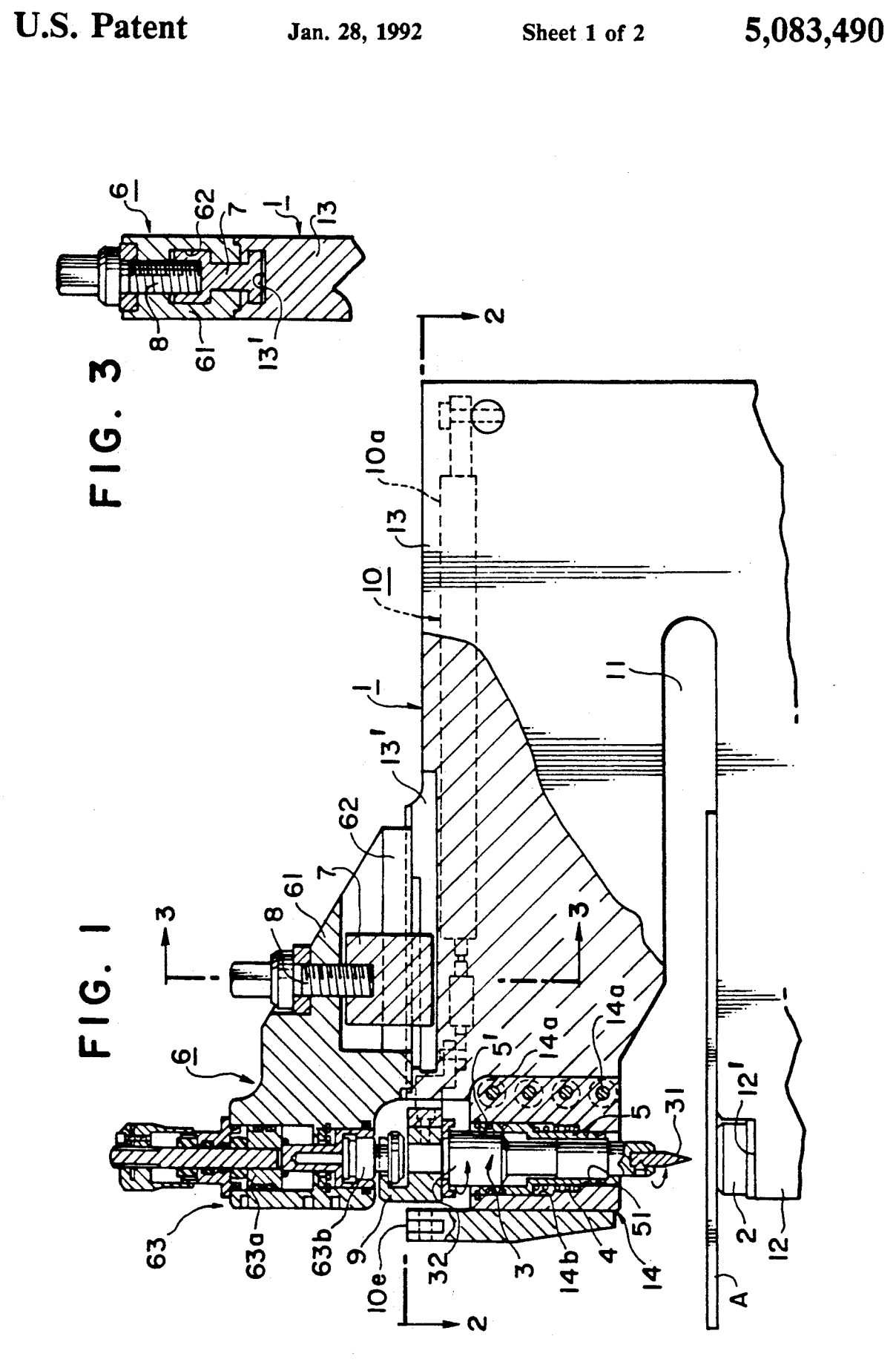

In this embodiment, as shown in FIG. 1, various parts and mechanisms are mounted on a support section 1 which is mounted and secured on a base plate (not shown) of the punching apparatus equipped with an automatic control mechanism and so forth.

The support section 1 having a throat 11 at center in which a material A to be punched will be inserted is a ]-shaped or channel-shape-frame comprising a lower half 12 and an upper half 13 that face each other through this throat 11.

The lower half 12 of the support section 1 contiguously facing a base is fixedly tightened by bolts thereto, and its end section is provided with a step section 12' for mounting a die 2.

The die 2 receives a punch 3 described later, and is preferably to be removably constituted correspondingly to the punch 3.

The upper half 13 of the support section 1 is mounted with a mounting cylinder 14 in which the punch 3 is to be installed in a position opposite to the die 2 mounted at the end section of the upper half 13. This mounting cylinder 14 secured to the upper half 13 by bolts 14a has a stepped inserting bore 14b tapering off as it goes downwardly. In this inserting bore 14b, the punch 3 is inserted vertically movable, rotatable, and removable through a spring 4 and a sleeve 5. This spring 4 functions to push the sleeve 5 upwardly. The sleeve 5 is a stepped cylinder type having a sliding surface of little friction in which a ball bearing 5' is embedded.

The punch 3 has a flat force-cutting blade 31 and also has a step section 32 at the shank section which is engaged with the step of the sleeve 5.

In the upper half 13 of the support section 1 is provided a dovetail groove 13' formed in the upper surface thereof for the mounting of the lifting mechanism 6.

The lifting mechanism 6 has a dovetail groove 62 in the lower surface of the base section 61. As shown in detail in FIG. 3, the lifting mechanism 6 is movable in relation to the support section 1 through a slider 7 which is engaged with both of this dovetail groove 62 and the above-mentioned dovetail groove 13'. This slider 7 is attached by a tightening bolt 8 to the base section 61 of the lifting mechanism 6. Tightening this tightening bolt 8 can securely fasten the lifting mechanism 6 to the support section 1. Also, this lifting mechanism 6 has, at the end of the base section 61, a piston structure 63 consisting of a piston 63a which is operated with a pneumatic pressure, an oil pressure, electric excitation, etc. and a shaft 63b fixed thereto.

The punch 3 and the lifting mechanism 6 are connected by a connector 9 which is pressed, or retained by a pin, in the rear end of the punch 3, and releasably locked on the lower end of a shaft 63b of a piston mechanism 63 of the lifting mechanism 6.

Furthermore, in the upper half 13 of the support section 1 the rotating mechanism 10 which turns the punch 3 through 90 degrees is supported.

The rotating mechanism 10, as shown particularly in FIG. 2, comprises a cylinder 10a driven with a pneumatic pressure, an oil pressure, etc.; a shaft 10b rotatably supporting the cylinder 10a in the upper half 13 of the support section 1; an arm 10c secured to the connector 9; a shaft 10d connecting the cylinder 10a to the arm 10c; and stoppers 10e and 10f restricting the range of movement of the arm 10c and setting the angle of rotation of the punch 3 to 90 degrees.

According to the embodiment described above, the lifting mechanism 6 is moved until the piston mechanism 63 comes on the same axis with, and is connected to, the punch 3 by the connector 9, and the piston mechanism 63 of the lifting mechanism 6 is driven to perform punching operation.

Figure 4:
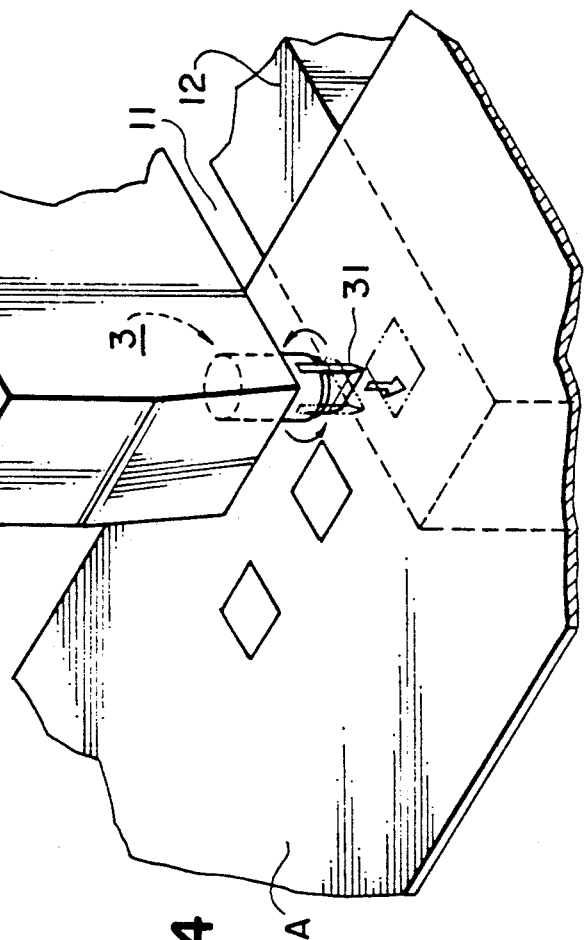
FIG. 4 is a diagrammatic perspective view showing the state of operation of FIG. 1.

In this punching operation, first in the state shown in FIG. 1, when the piston 63a and the shaft 63b of the piston 63 are moved downwardly, the punch 3 goes downwardly against the force of the spring 4, with its step section 32 engaged with the sleeve 5 through the connector 9, thus pressing to cut the material A on the die 2 into a form of straight line with the flat force-cutting blade 31 of the punch 3. After thus punching the straight line in the material, the piston 63a and the shaft 63b of the piston mechanism 63 are moved upwardly and the punch 3 is released at the step section 32 from engagement with the sleeve 5 through the connector 9. The sleeve 5 is also moved upwardly with the force of the spring 4. With the punch 3 held in the raised position, the material A is fed out in a direction orthogonal to the cut straight line, and then the punch is fed down to perform the above-described punching operation to cut another similar straight line, now completing the cutting of two opposite sides of a square hole. Thereafter, as shown in FIG. 4, the rotating mechanism 10 is operated to turn the force-cutting blade 31 of the punch 3 through 90 degrees and the punch is fed down to cut similar straight lines at the remaining two opposite sides of the square hole, thus completing the punching of the square hole. The spring 4 and the sleeve 5 have a function to absorb a force-cutting stress of the punch 3.

In this punching operation to cut each side of a square hole, a relatively large square hole can be produced without applying an excess stress to the material A and without producing distortion and burrs around the square hole produced.

Also, in this punching operation described above, the punch 3 can easily be pulled out of the mounting cylinder 13 and replaced by first disconnecting the connector 9 from the shaft 63b of the piston mechanism 63 of the lifting mechanism 6, loosening the tightening bolt 8 of the slider 7, and then by moving the base section 61 of the lifting mechanism 6 on the upper half 13 of the support 1.

The punching unit for punching apparatus according to the present invention is designed to force-cut each side of a square hole, and can accurately produce a relatively large square hole without distortion and burrs.

Furthermore, because it is easy to replace the punch, the size of the square hole to be produced can readily be changed by changing the length of cut of the force-cutting blade.

The present invention has been described in detail with particular reference to a preferred embodiment thereof but it will be understood that variations and modifications can be effected within the spirit and scope of the present invention.

What is claimed is:

1. A punching unit for punching apparatus comprising a punch removably mounted on an upper half side of a support section formed in a substantial channel shape such that said punch will face a die mounted on a lower half side of said support section; and a lifting mechanism movably mounted on said support section, for vertically moving said punch, and removably connected to said punch, said punching unit further comprising: a flat force-cutting blade attached at a bottom end of said punch, and a rotating mechanism provided in said support section for rotatably mounting said punch on said support section and for turning said punch through 90 degrees so that the sides of a square hole may be successively punched, wherein a mounting cylinder having an inserting bore is fixedly mounted in said upper half of said support section; said punch loaded with a spring acting upwardly, is rotatably and vertically movably inserted in said inserting bore of said mounting cylinder; and said punch and said lifting mechanism are mounted by a connector fixedly installed at a top end of said punch, wherein said rotating mechanism comprises a fluid cylinder, a shaft for rotatably supporting said cylinder in the upper half of said support section, an arm secured to said connector, a shaft connecting said cylinder to said arm, and two stoppers for limiting the range of movement of said arm and setting the angle of rotation of said punch to 90 degrees.

2. A punching unit for punching apparatus as claimed in claim 1, wherein said lifting mechanism has a piston mechanism comprising a piston and a shaft connected thereto, said shaft being locked by said connector to connect said lifting mechanism to said punch.

* * * * *